(12) United States Patent
Chan et al.

(10) Patent No.: US 6,870,232 B1
(45) Date of Patent: Mar. 22, 2005

(54) SCALABLE MOS FIELD EFFECT TRANSISTOR

(75) Inventors: Kevin Kok Chan, Staten Island, NY (US); Jack Oon Chu, Astoria, NY (US); Khalid EzzEldin Ismail, Giza (EG); Stephen Anthony Rishton, Hayward, CA (US); Katherine Lynn Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/550,990

(22) Filed: Apr. 17, 2000

Related U.S. Application Data

(60) Division of application No. 09/107,738, filed on Jun. 30, 1998, which is a continuation-in-part of application No. 08/683,329, filed on Jul. 18, 1996.

(51) Int. Cl.$^7$ ................................................ H01L 29/94
(52) U.S. Cl. ........................ 257/384; 257/382; 257/330
(58) Field of Search ................................. 257/155, 267, 257/280, 281, 284, 288, 382–384, 324–331, 192, 200, 201, 616, 471, 472, 476, 473, 51, 66, 347, 428

(56) References Cited

U.S. PATENT DOCUMENTS

| | | | |
|---|---|---|---|
| 4,521,446 A | * | 6/1985 | Coleman, Jr. et al. ........ 427/86 |
| 5,089,863 A | | 2/1992 | Satoh et al. |
| 5,159,416 A | * | 10/1992 | Kudoh ...................... 357/23.7 |
| 5,196,357 A | * | 3/1993 | Boardman et al. ............ 437/40 |
| 5,231,038 A | | 7/1993 | Yamaguchi et al. |
| 5,268,330 A | | 12/1993 | Givens et al. |
| 5,272,100 A | | 12/1993 | Satoh et al. |
| 5,405,787 A | | 4/1995 | Kurimoto |
| 5,418,391 A | * | 5/1995 | Huang ........................ 237/336 |
| 5,464,782 A | | 11/1995 | Koh et al. |
| 5,475,244 A | * | 12/1995 | Koizumi et al. ............ 257/192 |

FOREIGN PATENT DOCUMENTS

| | | |
|---|---|---|
| JP | 04-180633 | 6/1992 |
| JP | 06-350085 | 12/1994 |
| TW | 205579 | 7/1995 |
| TW | 266313 | 12/1995 |

OTHER PUBLICATIONS

Donald A. Neamen, Semicondcutor Physics & Devices Basic Principles, second edition. The McGraw–Hill Companies, Inc., 1992 and 1997. pp 1–3, 16, 17 and 19.*

A. Acovic et al., "Novel Gate Process for 0.1 Micron MOSFETs", IBM Technical Disclosure Bulletin, vol. 36, No. 11, Nov. 1993.

Handbook of Thin Film Technology, by L.I. Maissel and R. Giang. McGraw–Hill (1970), pp. title, 5–1 to 5–3, 5–16 to 5–21, 19–1 to 19–5 and 19–16 to 19–25.

* cited by examiner

Primary Examiner—Eddie Lee
Assistant Examiner—Douglas W. Owens
(74) Attorney, Agent, or Firm—Scully, Scott, Murphy & Presser; Robert M. Trepp, Esq.

(57) ABSTRACT

A field effect transistor and method for making is described incorporating self aligned source and drain contacts with Schottky metal-to-semiconductor junction and a T-shaped gate or incorporating highly doped semiconductor material for the source and drain contacts different from the channel material to provide etch selectivity and a T-shaped gate or incorporating a metal for the source and drain contacts and the oxide of the metal for the gate dielectric which is self aligned.

9 Claims, 8 Drawing Sheets

SCALABLE MOS FIELD EFFECT TRANSISTOR

This is a division of application Ser. No. 09/107,738, filed Jun. 30, 1998, which is a continuation-in-part application of application Ser. No. 08/683,329 filed on Jul. 18, 1996.

FIELD OF THE INVENTION

This invention relates to semiconductors and more particularly to self aligned metal oxide semiconductor (MOS) field effect transistors (FET's) having submicron gate lengths with a T-shaped gate.

BACKGROUND OF THE INVENTION

State-of-the-art metal-oxide-semiconductor field effect transistors require shrinking the gate length below 0.25 $\mu$m. The standard process for forming the gates is by depositing a polysilicon layer, etching this layer to define the required gate length, and using the polysilicon as a mask for the source/drain shallow implant step. The shallow implant step is followed by forming a nitride sidewall spacer, implanting the deep ohmic region in the source/drain and then forming a metal silicide to the gate and the source/drain implant. The resistance of the gate thus increases as the gate length is reduced, because the gate metal silicide has the same gate length as the polysilicon gate underneath. The gate resistance slows down the devices because of the RC time delay. Alternatively, one can form a metal gate which is longer than the polysilicon gate by opening a window in an oxide layer and patterning metal. This process has produced the fastest silicon devices to date, but requires a highly critical realignment to the initial polysilicon gate, which if not successful, would result in shorting the gate with the ohmic source/drain contacts. Therefore the above process is not compatible with manufacturing.

In addition to an increase in gate resistance due to scaling down the gate length in MOS FET'S, the ohmic source/drain contacts formed by ion implantation cannot be scaled in depth as required to keep the aspect ratio of gate length to junction depth greater than 1. As the gate length of the MOS FET's are scaled, to smaller dimensions the resistance of the ohmic regions increases, which degrades the speed performance of the FETs. The threshold voltage has to be adjusted by a channel implant, which has to become shallower in order to prevent short channel effects. The shallower implant, in turn, reduces the carrier mobility in the inversion layer, and is also becoming more difficult to control.

SUMMARY OF THE INVENTION

In accordance with the present invention, a structure and process sequence is described for building field effect transistors which can easily be scaled to submicron dimensions both in length and in width. The process relies on forming either Schottky metal ohmic source/drain contacts or raised, in-situ doped epitaxial ohmic contacts, and a metal or metal/polysilicon gate which is self aligned and may have a T-shape in order to reduce the parasitic gate resistance.

The invention provides a process for forming the gate stack, which allows a T-shaped metal gate with no critical alignment steps, and which results in a greatly reduced gate resistance.

The invention further provides a process which allows the formation of extremely shallow source/drain contacts, which are scalable in area.

The invention eliminates the need for gate stack silicon nitride sidewall spacers.

The invention further provides a new process that allows the formation of T-gates, self aligned to existing shallow source-drain contacts, without any critical alignment needed for example an alignment accuracy of about 0.2 $\mu$m for a gate length in the range of 0.05 to 0.2 $\mu$m.

The invention further provides a new alternative process where the gate is formed by L.I. metal or metal/polysilicon combination, without any silicidation needed, and results in an extremely low gate contact resistance.

The invention further provides a new process in which the source/drain contacts can be made by either a metal barrier or junction or an in-situ-doped semiconductor with respect to the channel, thus avoiding ion implantation and annealing. The high conductivity of the contacts described herein allows the scaling of the area of the contacts for high packing density circuits.

The invention further provides a self aligned raised epitaxial channel formed between raised semiconductor regions forming the source and drain.

The invention further provides a new process in which the same source/drain contact metal, for example titanium, can be selectively and locally oxidized to form the gate dielectric material, titanium dioxide, having a high dielectric constant, thus relaxing the scaling limits on the gate dielectric thickness.

BRIEF DESCRIPTION OF THE DRAWING

These and other features, objects, and advantages of the present invention will become apparent upon a consideration of the following detailed description of the invention when read in conjunction with the drawings, in which.

DESCRIPTION OF THE PREFERRED EMBODIMENTS

Figure 1:
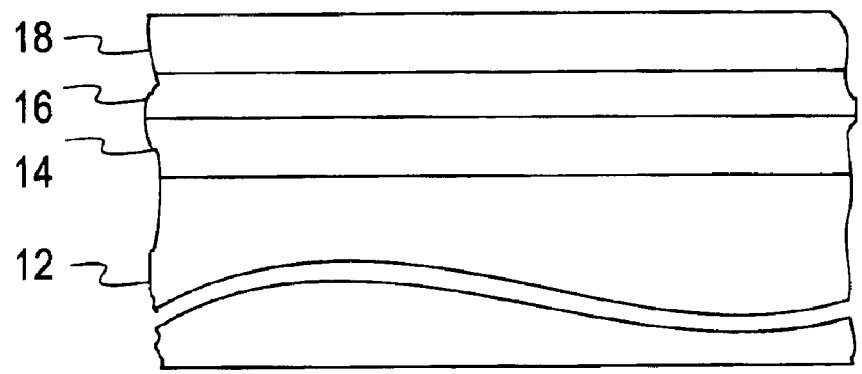
FIG. 1 is a cross section view illustrating early steps in forming the embodiment shown in FIG. 7.

Referring now to the drawing, FIG. 1 shows a cross section view of substrate 12, a sacrificial layer 14, a metal layer 16 which subsequently forms a Schottky barrier or junction with respect to the channel, and an insulating layer 18. Substrate 12 may be a single crystal semiconductor material suitable to form the channel of a MOS FET to be built. Substrate 12 may be, for example, silicon, silicon germanium, germanium, gallium arsenide, indium gallium arsenide, indium phosphide, and indium gallium arsenide phosphide. Sacrificial layer 14 is of a material which may be selectively etched with respect to substrate 12 and which may be consumed by Schottky metal layer 16, for example, in the form of a silicide or germanide. Sacrificial layer 14 functions to protect the channel from reactive ion etching (RIE) damage. Sacrificial layer 14 may be for example silicon germanium with a germanium content x where x is equal to or greater than 0.3 and the silicon content is 1-x. Sacrificial layer 14 may also be GaAs, InGaAs, InP, $In_{1-x}Ga_xAs_yP_{1-y}$, and Si. The material for metal layer 16 forms the source and drain of the MOS FET and is of a material having an appropriately selected work function. Metal layer 16 may be, for example, Co, Ni, Pd, Pt, Rh, Ta, Ti, W, combinations thereof and alloys thereof to provide a selected barrier height and may be blanket deposited by evaporation or sputtering. Metal layer 16 is then covered by insulating layer 18 which may be for example a low temperature deposited oxide such as by CVD using tetra ortho ethyl silicate (TEOS) as the precursor.

Figure 2:
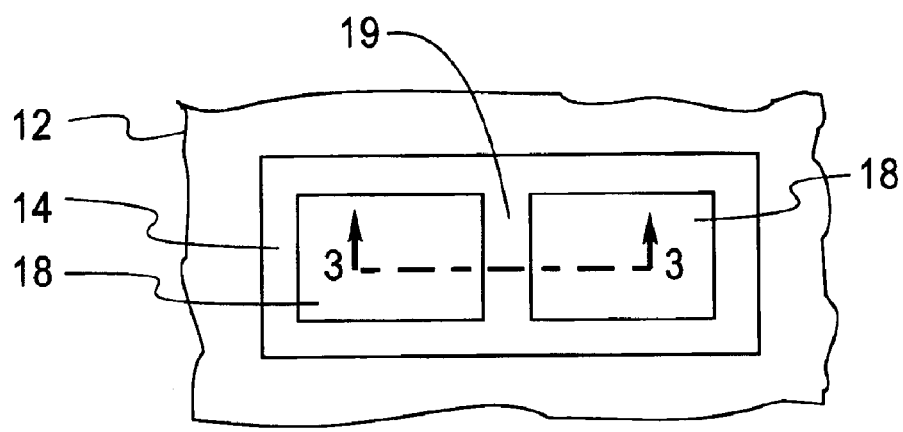
FIG. 2 is a top view of the structure of FIG. 1 after the step of etching.
Figure 3:
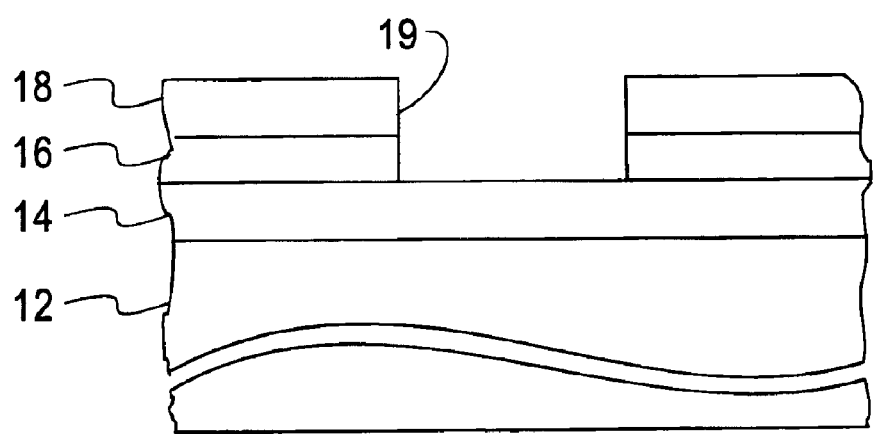
FIG. 3 is a cross section view along the line 3—3 of FIG. 2.

Next, a resist is deposited on insulating layer 18 and lithographically patterned to define a gate window 19 and future source and drain regions as shown in FIG. 2. The gate window is opened through insulating layer 18 and metal layer 16 by using for example RIE. A trench is formed around future source and drain regions. FIG. 3 shows a cross section view along the line 3—3 of FIG. 2. FIG. 3 shows a sacrificial layer 14 over substrate 12 in gate window 19 such that the RIE damage does not reach the channel of the MOS FET to be built.

Figure 4:
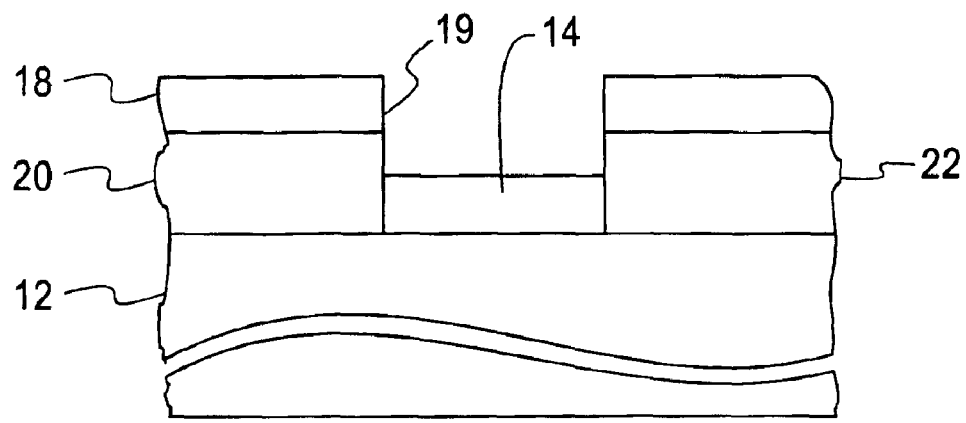
FIGS. 4–6 are cross section views illustrating further steps in forming the embodiment shown in FIG. 7.

Next as shown in FIG. 4, metal layer 16 and sacrificial layer 14 underneath it are alloyed to form source and drain contacts 20 and 22 while not disturbing sacrificial layer 14 in gate window 19. Source and drain contacts 20 and 22 form Schottky barriers or junctions 23 and 24, respectively, with channel 25 in substrate 12 shown in FIG. 5. The ratio of thickness of metal layer 16 to sacrificial layer 14 and the temperature are adjusted to permit complete alloying of layer 14 to form Schottky source and drain junctions to the channel. There may be some alloying with substrate 12 at the original substrate 12 interface. The penetration of alloying into substrate 12 is slight and just enough to remove the heterojunction of sacrificial layer 14 and substrate 12. For example, sacrificial layer 14 may be SiGe, substrate 12 may be Si, and Schottky metal layer 16 may be Ti for a n channel FET. Upon the step of siliciding which may occur at a temperature at or above 600° C., a silicide or mixed silicide may be formed, for example, titanium silicide and titanium germanide. For a p channel FET, Schottky metal layer 16 may be for example Pt. Upon the step of siliciding at or above 250° C., platinum silicide and platinum germanide may be formed.

Figure 5:
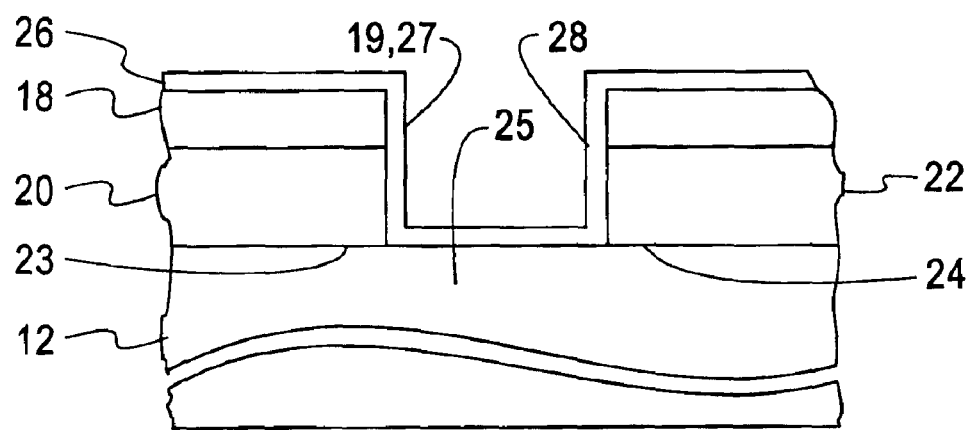

Next as shown in FIG. 5, a gate dielectric 26 is formed or grown on substrate 12 in gate window 19, sidewalls 27 and 28 of gate window 19 and the upper surface of insulating layer 18. Gate dielectric 26 may be, for example, silicon oxide, silicon nitride, silicon oxynitride, or a silicon oxide/silicon nitride composite, and may have a thickness in the range from 2 to 20 nm and typically 3 to 5 nm.

Figure 6:
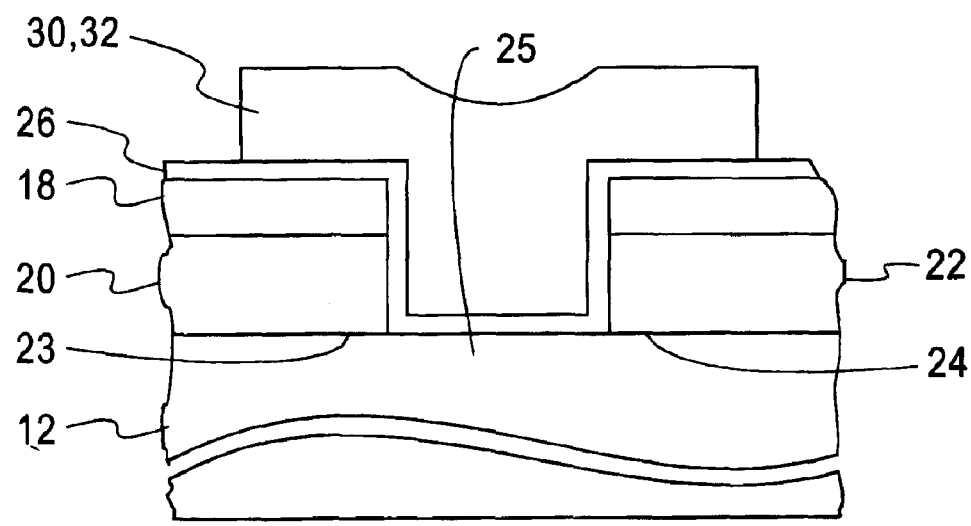

Referring to FIG. 6, a gate material 30 which may be, for example, Al, W, with or without appropriate diffusion barriers and with or without polysilicon underneath is either blanket deposited or grown over gate dielectric 26 and patterned lithographically to define a T-shaped gate 32. T-shaped gate 32 extends over insulating layer 18 above gate dielectric 26. A negative resist may be used in the process of patterning lithographically.

Figure 7:
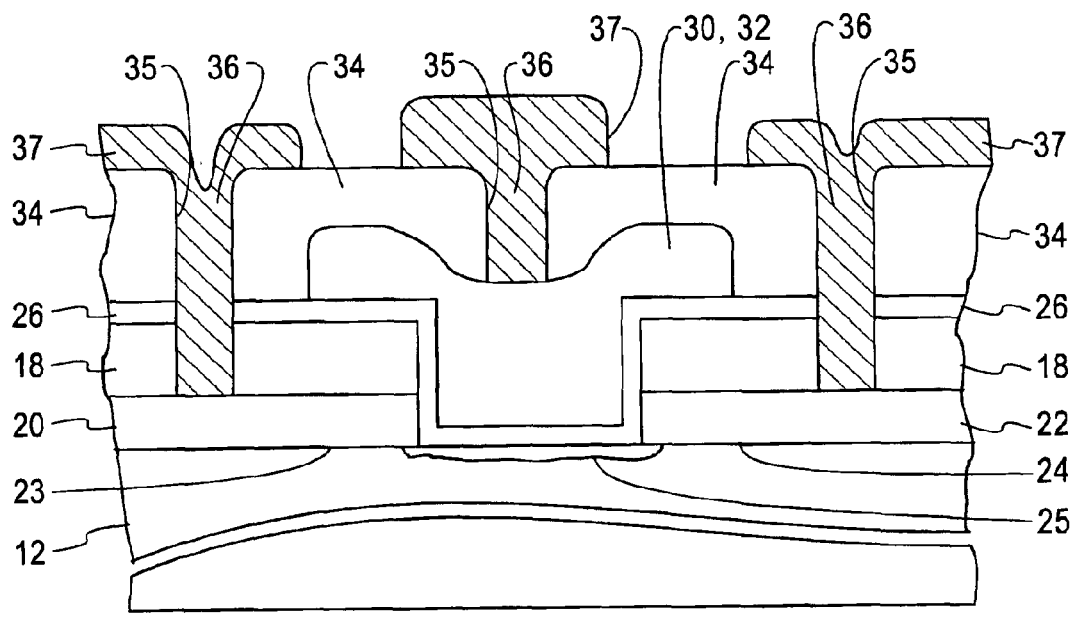
FIG. 7 is a cross section view of one embodiment of the invention.

An insulating material 34 which may be, for example, silicon dioxide or a flowable oxide is formed over exposed gate dielectric 26 and T-shaped gate 32. Holes or openings 35 may be opened through insulating material 34 as shown in FIG. 7. The holes or openings 35 may be subsequently filled with conductive material 36 for example tungsten and planarized via chemical mechanical polish (CMP) to form vias coplanar with the upper surface of insulating material 34 (not shown). Alternatively, a metal layer 37 may be formed filling holes 35 with conductive material 36 and forming a layer on insulating material 34. Metal layer 37 may be patterned to provide circuit interconnections.

Figure 8:
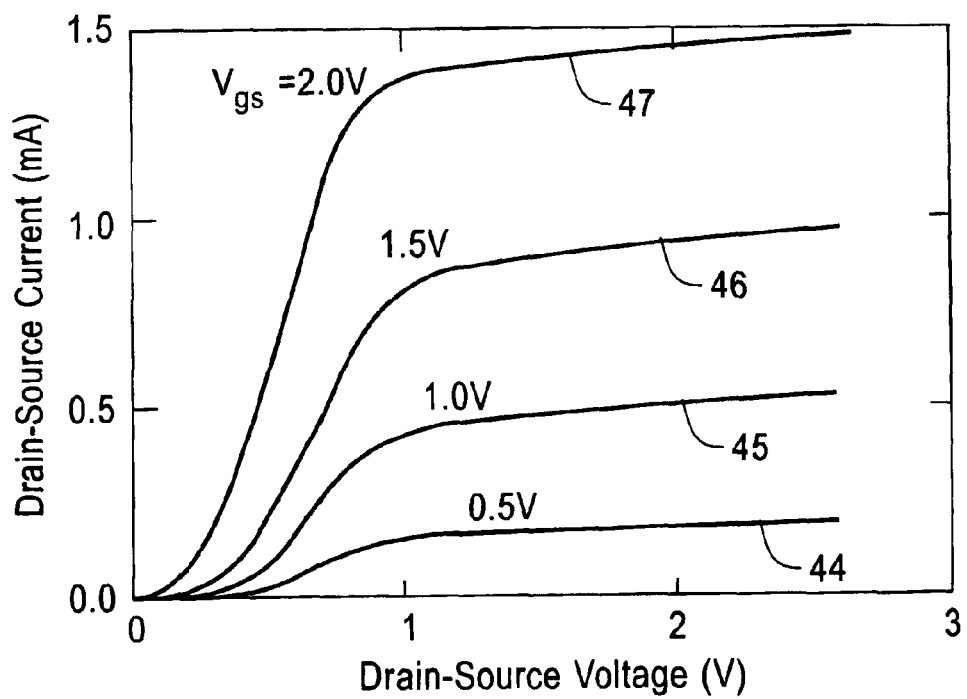
FIG. 8 is a graph of the Drain-Source Current verses Drain-Source Voltage showing measurements made for the embodiment shown in FIG. 7.

FIG. 8 shows a graph of the drain-source current versus drain source voltage for the embodiment of FIG. 7 with a gate length of 0.25 $\mu$m. The FET measured was an n channel with source contact 20 and drain contact 22 being a mixture of titanium silicide and titanium germanide formed by alloying a titanium layer 16 with a sacrificial layer of $SiGe_x$ where x is 0.3. The metal gate had a layer of Ti of 50 Angstroms and a layer of Al of 1500 Angstroms. The top or T length of the T shaped gate was 0.5 $\mu$m. In FIG. 8 the ordinate represents drain-source current and the abscissa represents drain-source voltage. Curves 44–47 were plotted from measurements with the gate voltage at 0.5V, 1.0V, 1.5V and 2.0V respectively. The transconductance $g_t$ was equal to about 210 mS/mm and output conductance $g_d$ was equal to about 10 mS/mm.

Figure 9:
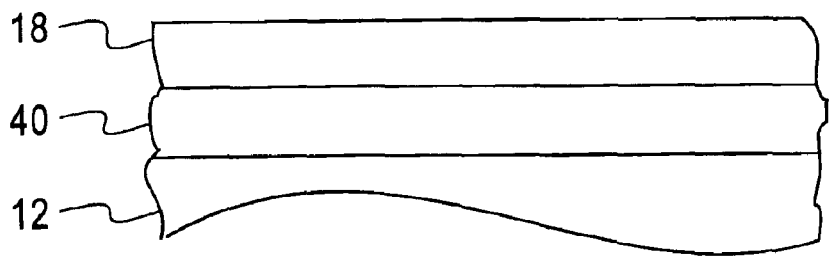
FIGS. 9–11 are cross section views illustrating the fabrication steps in forming the embodiment shown in FIG. 12.
Figure 10:
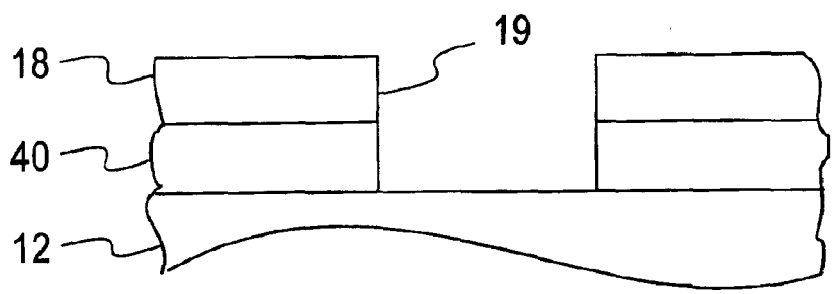
Figure 11:
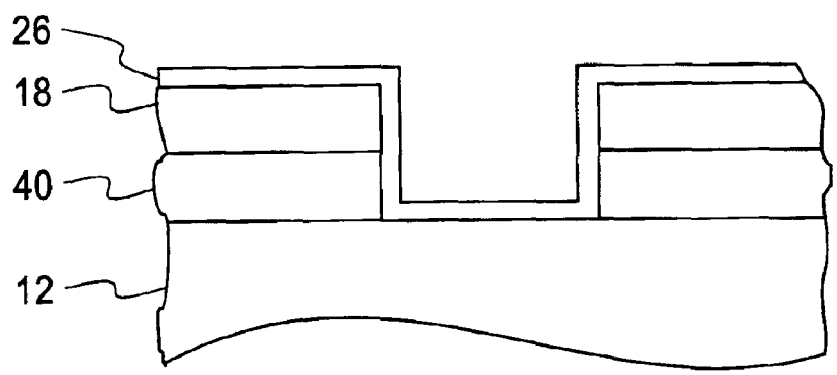
Figure 12:
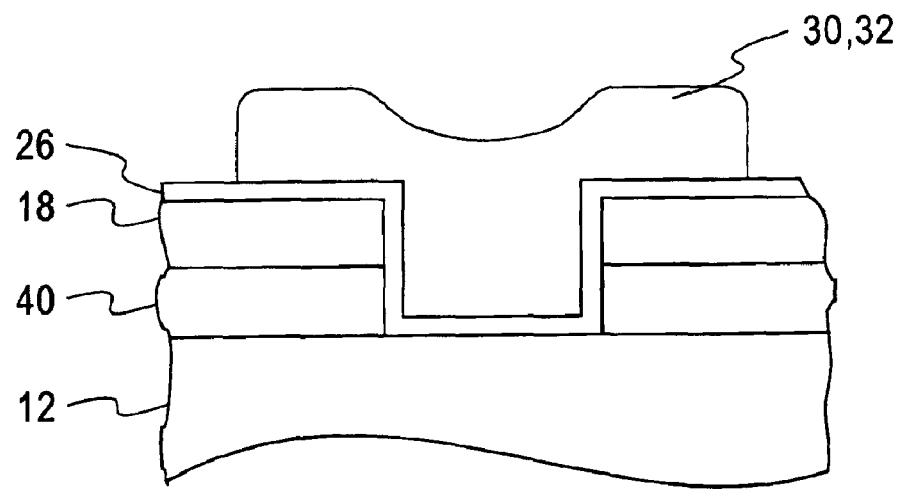
FIG. 12 is a cross section view of a second embodiment of the invention.

Referring to FIG. 9, a cross section view is shown of the early steps of a process for forming the embodiment shown in FIG. 12. In FIGS. 9–12, like references are used for functions corresponding to the apparatus of FIGS. 1–7.

Referring again to FIG. 9, a semiconductor layer 40 is formed on substrate 12. Semiconductor layer 40 may be a single crystal or a polycrystalline material which can be selectively etched by way of a wet etch or RIE with respect to substrate 12. For example, substrate 12 may be silicon and semiconductor layer 40 may be silicon germanium alloy or vice versa or, substrate 12 may be GaAs and semiconductor layer 40 may be InGaAs or vice versa. Semiconductor layer 40 may be highly doped, for example, in the range from $5 \times 10^{19}$ to $5 \times 10^{20}$ atoms/cm$^3$ and functions as the source and drain of the MOS FET shown in FIG. 12. Semiconductor layer 40 may be doped p-type for a p channel MOS FET and doped n-type for an n channel MOS FET. Semiconductor layer 40 may be epitaxially formed in-situ over substrate 12. Semiconductor layer 40 may then be covered by insulating layer 18 which may be for example an oxide formed at low temperature. Referring to FIG. 10, lithography is then used to open gate window 19 in insulating layer 18 and semiconductor layer 40 using for example, RIE.

Referring to FIG. 11, a gate dielectric is deposited in gate window 19 on substrate 12 and over the upper surface of insulating layer 18.

Referring to FIG. 12, a gate material 30 is formed over gate dielectric 26 and patterned lithographically to define a T-shaped gate 32. Gate material 30 extends from gate window 19 over the upper surface of insulating layer 18 with or without gate oxide therebetween. Gate dielectric 26 may be removed over insulating layer 18 prior to depositing gate material 30.

Figure 13:
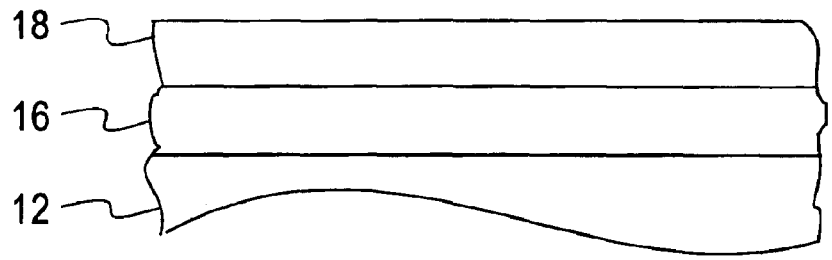
FIGS. 13–15 are cross section views illustrating the fabrication steps in forming the embodiment shown in FIG. 16.
Figure 15:
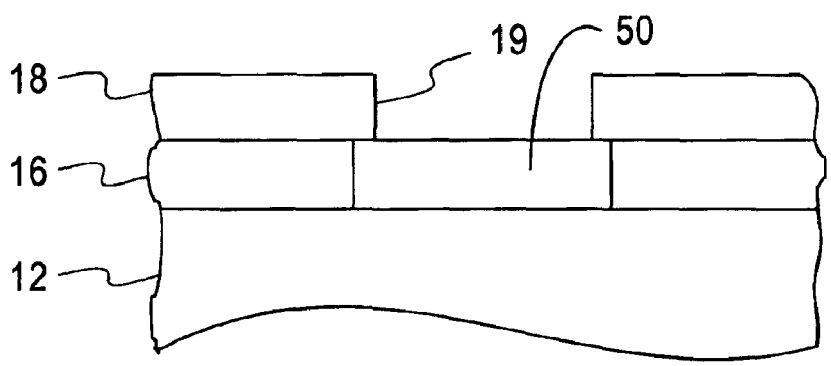
Figure 16:
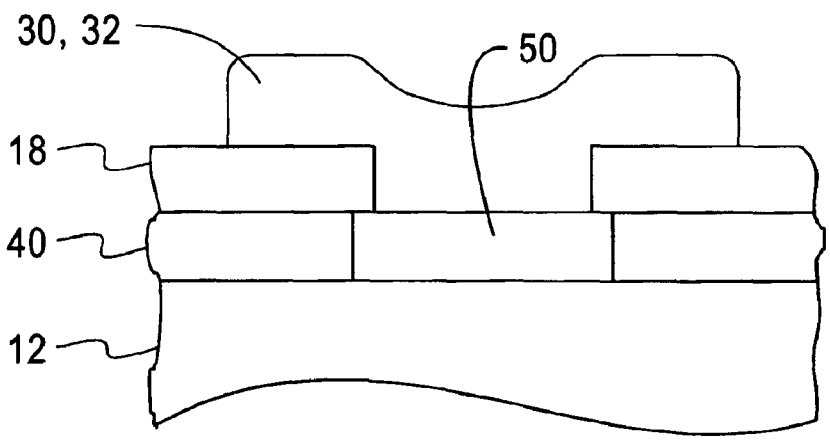
FIG. 16 is a cross section view of a third embodiment of the invention.

FIG. 13 shows the early steps in forming an MOS FET shown in FIG. 16. In FIGS. 13–16 like references are used for functions corresponding to the apparatus of FIGS. 1–7 and 9–12. Substrate 12 has on its upper surface metal layer 16 which may be any metal, for example, Al, Er, HP, Nb, Pt, Ta, Ti, Y, W, or ZR. An insulating layer 18 which may be for example silicon nitride is formed on the upper surface of Schottky metal layer 16.

Figure 14:
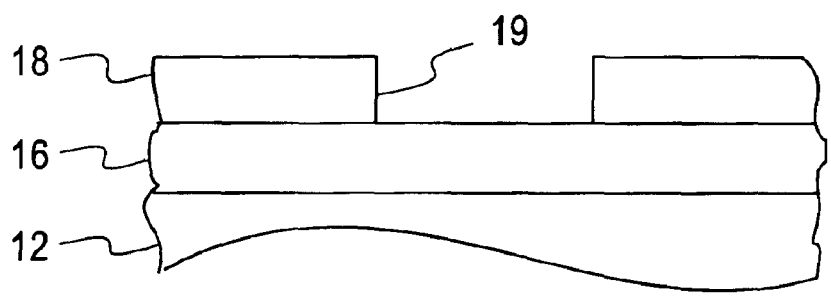

A gate window 19 is formed in insulating layer 18 as shown in FIG. 14. After opening gate window 19, metal layer 16 where exposed is oxidized to form for example $Tio_2$ which becomes gate dielectric 50 as shown in FIG. 15. If the temperature is kept below 700° C. during oxidation then substrate 12 if silicon will not oxidize at the interface.

The oxidation process for oxidizing metal layer 16 in gate window 19 to form gate dielectric 50 may be thermal. In this case, insulating layer 18 must also act as a diffusion barrier to oxygen to prevent oxidation of the source/drain metallurgy, metal layer 16 beneath insulating layer 18. A preferred material for insulating layer 18 would be silicon nitride. $SiO_2$ is not as preferred as a material since it is typically too permeable to ambient oxygen during oxidation. Gate dielectric 50 may alternatively be formed by an electrochemical anodic oxidation process, such as described in *Handbook of Thin film Technology*, by Maissel and R. Glang, McGraw-Hill, Inc. (1976), chapters 5 and 19. Electrochemical anodic oxidation of metal layer 16 in gate window 19 may be used to produce metal oxides which may be for example $Al_2O_3$, $Er_2O_3$, $HfO_2$, $Nb_2O_5$, PdO, PtO, $Ta_2O_5$, $TiO_2$, $WO_3$, $Y_2O_3$ and $ZrO_2$ from respective metals Al, Er, Hf, Nb, Pd, Pt, Ta, Ti, W, Y and Zr. Some of the above metals may form oxides other than those listed above. Furthermore, some of the above mentioned metal oxides such as PdO and PtO may be less preferred due to their relatively high conductivities. The other oxides listed above are preferred. Relative to thermal oxidation, electrochemical anodic oxidation processes have the advantages of (i) lower processing temperature in the range where the electrolyte is in the liquid phase, typically from about 0° C. to about 100° C., (ii) greater spatial selectivity, in that oxidation will only begin on metal surfaces directly in contact with the electrolyte, and (iii) easier process control over uniformity and endpoint. For example, control over process uniformity may be easier because the maximum metal oxide film thickness can be set by the applied voltage, instead of by the time integral of an average current density that may show strong local variations. This self-limiting aspect of oxide formation thus makes it easier to make a uniform oxide over a wider variety of pattern densities and feature sizes. Additional process parameters influencing oxide quality and thickness include the metal type and purity, and the electrolyte composition and temperature.

Gate dielectric 50 may alternatively be formed in gate window 19 by a reaction of metal layer 16 and a gaseous plasma to produce an oxide, nitride or oxynitride. Formation of gate dielectric 50 by the process of electrochemical anodic oxidation, plasma oxidation or plasma nitridation may further include one or more subsequent thermal treatments, for example, heating in a reactive or nonreactive ambient to a temperature above a selected temperature.

Next, a gate material 30 is formed over gate dielectric 50 and patterned lithographically to define a T-shaped gate 32 as shown in FIG. 16.

Figure 17:
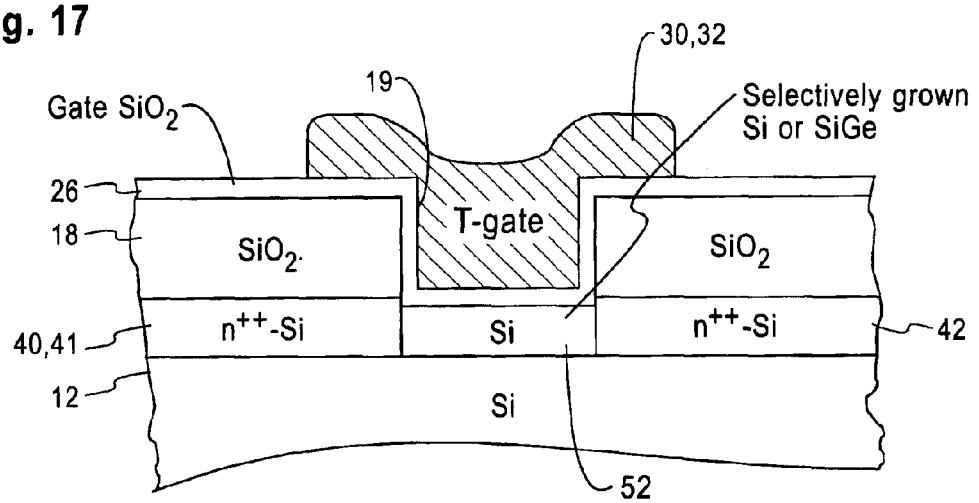
FIG. 17 is a cross section view of a fourth embodiment of the invention.

In a variation shown in FIG. 17, after opening the gate window 19 in the Schottky metal layer 16 shown in FIG. 3 or in in-situ heavily doped layer 40 shown in FIG. 10, the sample or substrate 12 may be inserted in an epitaxial growth system, which can selectively grow a required semiconductor such as Si or SiGe in gate opening 19 on substrate 12 to form channel 52 without growing a semiconductor on top of insulating layer 18 of silicon dioxide or silicon nitride. The epitaxial layer forming channel 52 results in a raised FET channel which is in electrical or actual contact from both sides by the source 41 and drain 42. Lattice strain can be introduced in channel 52 by growing a heterostructure such as Si/SiGe and/or graded compositions in order to make use of enhanced transport properties (e.g. mobility) as described in U.S. Pat. No. 5,534,713 which issued on Jul. 9, 1996 to K. E. Ismail, a coinventor herein and F. Stern which is assigned (one half) to the assignee herein and which is incorporated herein by reference to show the formation of strained layers to increase mobility etc.

After formation of epitaxial channel layer 52, a gate dielectric 26 is formed over channel layer 52, the sidewalls of gate window 19, and on the upper surface of insulating layer 18. A T-shaped gate 32 of gate material 30 is formed over gate dielectric 26.

In FIGS. 17–20, like references are used for functions corresponding to the apparatus of FIGS. 1–7 and 9–16.

Figure 18:
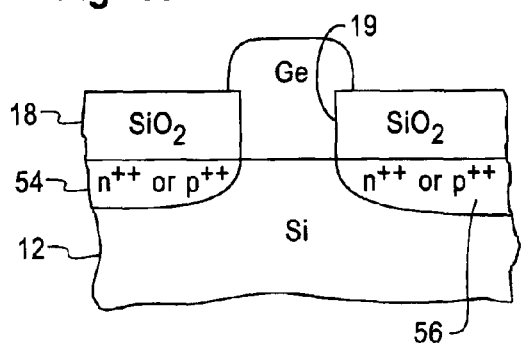
FIGS. 18 and 19 are cross section views illustrating process steps using ion implantation and for protecting the channel during ion implantation in forming the embodiment shown in FIG. 20.
Figure 19:
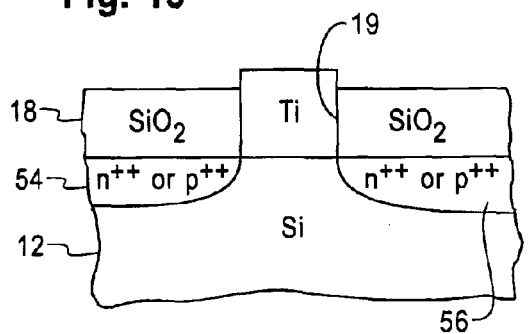
Figure 20:
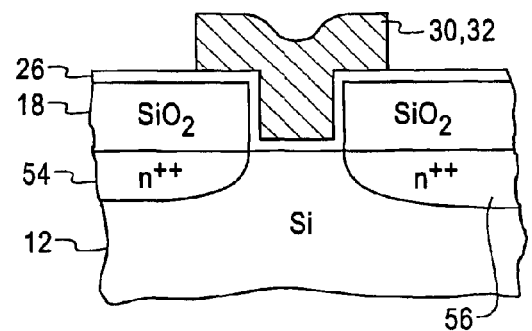
FIG. 20 is a cross section view of a fifth embodiment of the invention.

In another variation as shown in FIGS. 18–20, an insulating layer 18 is first deposited on substrate 12 and then lithographically patterned to open or form gate window 19 in insulating layer 18 which may be for example silicon dioxide. Gate window 19 can be filled by metal for example Ti using resist lift off or by a semiconductor such as Ge using selective growth. In both cases the gate window is filled with material that is chosen such that it can stop the implanted species during implant of the source and drain which are implanted through insulating layer 18 for forming shallow self aligned source region 54 and drain region 56. The window material which may be for example Ge as shown in FIG. 18 or Ti as shown in FIG. 19 can thus easily be selectively etched with respect to the semiconductor substrate 12 underneath, substrate 12 which may be for example Si or SiGe alloy or combinations thereof. Following an annealing step to activate the implant, gate dielectric 26 is deposited and the rest of the process for forming the T-gate for the FET is done.

In all of the above proposed processes, the choice of the ohmic contacts and the gate metal, depends on the required threshold voltages and the device design. The work function of the metal used for source and drain contacts as shown, for example in FIGS. 7 and 16, is a subject of optimization. The higher the Schottky barrier height between the metal and the semiconductor, the higher the series access resistance from source and drain contacts to the channel. On the other hand, electrons or holes overcoming this barrier have to be very energetic and hence have a high injection velocity and maintain this velocity under the gate. Highly-doped semiconductor source and drain contacts as shown in FIG. 12 have lower injection barriers but are also more resistive than metal contacts. Therefore, depending on the application and the threshold voltages required, one or the other processes shown above can be chosen to build corresponding FET's shown in FIGS. 7, 12 and 16.

Figure 21:
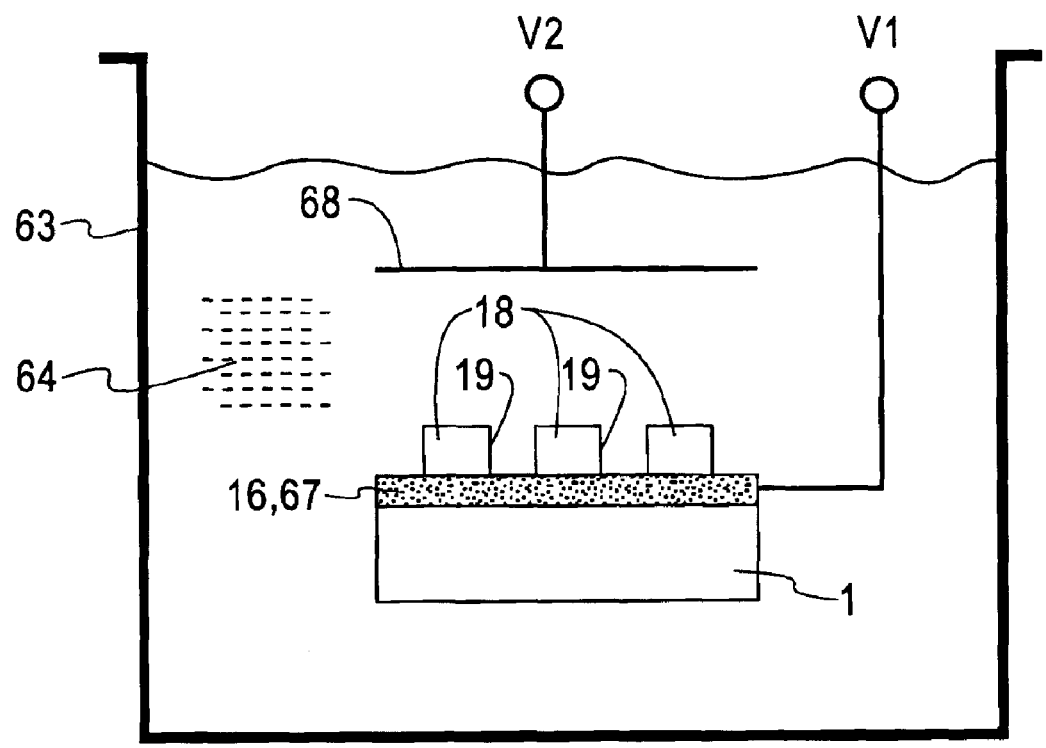
FIG. 21 shows a schematic view of an electrochemical anodic oxidation set-up.

A schematic of an electrochemical anodic oxidation set-up to form the structure of FIG. 15 is shown in FIG. 21. The electrochemical cell consists of housing 63 containing electrolyte solution 64, a working piece such as metal layer 16 acting as electrode 67, and counter electrode 68 positioned in electrolyte solution 64 spaced from metal layer 16. Electrolyte solution 64 may be for example concentrated $HNO_3$, 0.1% to 10% citric acid, or about 10% acetic acid. Insulating layer 18 protects underlying metal layer 16 of regions that will become the source/drain 74 metallurgy.

Figure 22:
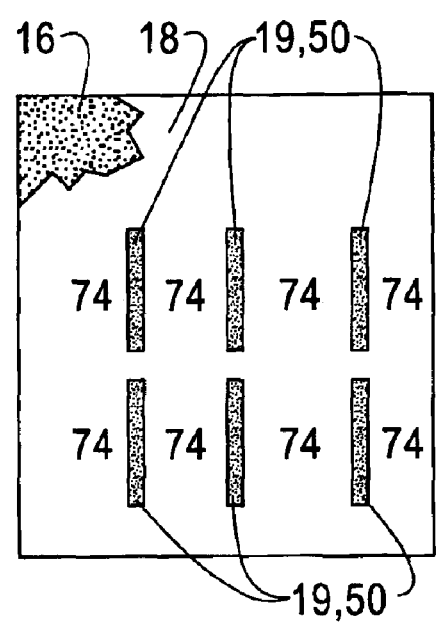
FIG. 22 shows a top view of several gate oxide regions during a step in fabricating a sixth embodiment of the invention.

FIG. 22 illustrates a top view of several gate oxide regions 50 in respective gate windows 19 surrounded by insulating layer 18 and still-connected metal layer 16 below insulating layer 18 which will be subsequently patterned to form source/drain 74 contact regions on either side of gate oxide 50. Metal layer 16 on substrate 1 may be used as the electrode throughout the anodization process since the gate oxide regions 50 in respective gate windows 19 are always formed as isolated islands that do not interfere with the connectedness of the surrounding source/drain 74 electrode metal.

T-shaped gate structures incorporating a gate oxide or nitride formed by oxidation or nitridation of an in-situ metal layer 16 need not be limited to the device geometry shown in FIG. 16. For example, the source/drain metallurgy may consist of a bottom metal layer 16 which is locally oxidized or nitridized in gate window 19 to form gate dielectric 50. One or more conductive layers of low resistance material may be formed over metal layer 16 to reduce the source/drain resistance.

Figure 23:
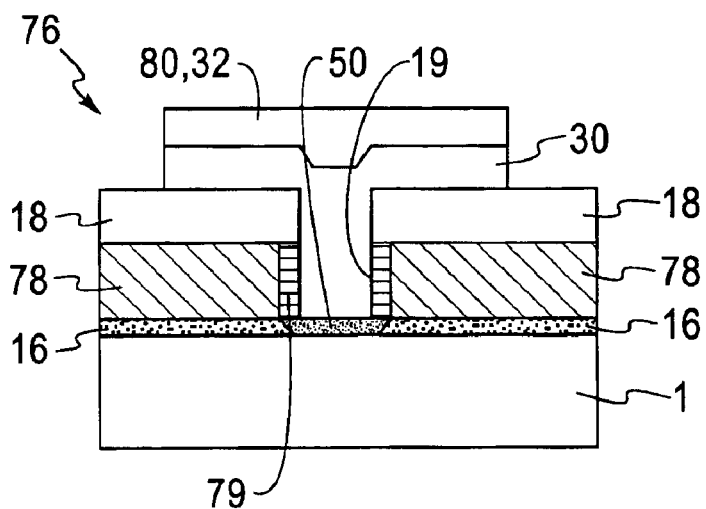
FIG. 23 shows a cross section view of a sixth embodiment of the invention.

FIG. 23 shows an embodiment of a field effect transistor 76 containing a double layer source/drain metallurgy comprising bottom layer 16 and top layer 78. Gate dielectric 50 is a metal oxide, nitride, or oxynitride of the metal used for bottom layer 16. Insulating sidewall layers 79 in the gate window may be formed on the sidewalls of top layer 78 before, during or after formation of gate oxide 50, by a process such as thermal oxidation, electrochemical anodic oxidation, plasma oxidation, plasma nitridation, or combinations thereof, to electrically isolate layer 78 from subsequently formed T-shaped gate 32. A second layer of low resistance material 80 may be formed over gate material 30 prior to patterning to form T-shaped gate 32.

The embodiment in FIG. 23 has the advantage that upper conductive material 78 may be selected for its low resistivity while bottom conductive material 16 may be selected for the electrical qualities of its oxide or nitride dielectric, its Schottky barrier properties, and its compatibility with the underlying substrate material 1. Metal layer 16 should preferably be thin to enable complete oxidation of metal layer 16 with a minimum of oxidation under layer 78 at the edges of gate window 19, to avoid increasing the gate length of transistor 76.

Figure 24:
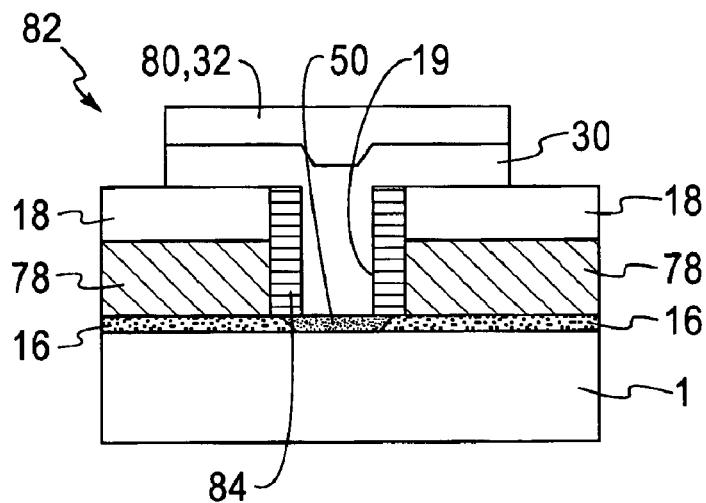
FIG. 24 shows a cross section view of a seventh embodiment of the invention.

An alternative to the insulating sidewall layers 79 is shown in FIG. 24, where field effect transistor 82 contains a double layer source/drain metallurgy comprising bottom layer 16 and top layer 78. As in FIG. 23, gate dielectric 50 is a metal oxide, nitride, or oxynitride of the metal used for bottom layer 16. Insulating sidewall spacers 84 are formed by conformally depositing a thin dielectric layer on metal layer 16 in gate window 19, sidewalls of conductive material 78 in gate window 19, and upper surface of insulating layer 18, and then anisotropically etching said thin dielectric layer by a process such as reactive ion etching (RIE) to produce sidewall spacers 84. Metal layer 16 in the gate window 19 may also be etched to reduce thickness and to clean the surface prior to oxidation or nitridation.

The bottom metal layer 16 should ideally not react with or consume the underlying semiconductor substrate 1, and should act as a barrier against the reaction of the upper conductive layer 78 with substrate 1. An example of a suitable bottom layer 16/top layer 78 combination is Ta/Al. Ta is a good barrier material and forms an excellent $Ta_2O_5$ gate oxide. However, the resistivity of Ta in its thin film beta phase form is 170 micro-ohm-cm which is too high for to be used alone as a source/drain contact metal. In contrast, Al has a low resistivity. However, without a material such as Ta to act as a barrier to such reaction, the Al may react with substrate material 1 during anneals required in subsequent process steps in forming an integrated circuit.

Figure 25:
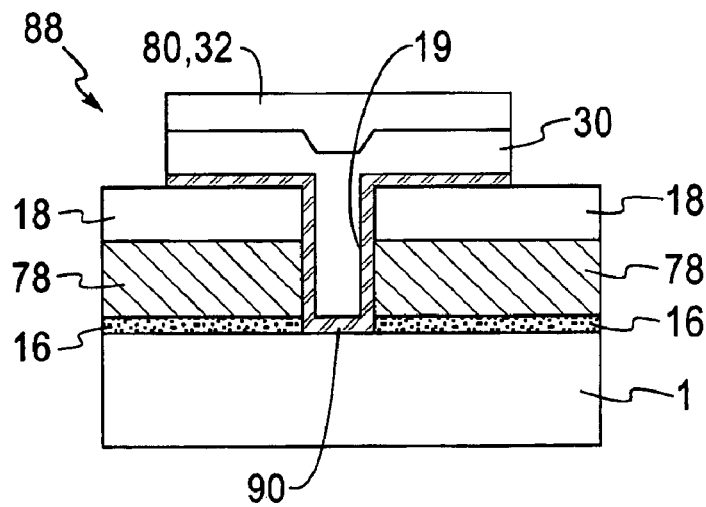
FIG. 25 shows a cross section view of an eighth embodiment of the invention.

FIG. 25 shows another field effect transistor structure 88 having the same double layer source/drain metallurgy as the structures 76 and 82 in FIGS. 23 and 24. Dielectric 90 replaces gate dielectric 50 and sidewall insulators 79 or 84 shown in FIG. 24, and is deposited in gate window 19, on the sidewalls of conductive material 78 in gate window 19, and on upper surface of insulating layer 18. Dielectric 90 may be a deposited silicon oxide, silicon nitride, or silicon oxynitride, or silicon oxide/silicon nitride composite or it may be an oxide, nitride, or oxynitride of a deposited metal layer, formed for example by deposition of Al, Er, Hf, Nb, Ta, Ti, W, Y, Zr and mixtures thereof and subsequent electrochemical anodic oxidation, thermal oxidation, gaseous plasma anodization, or combinations thereof.

The invention described herein can be used in building field-effect transistors such as metal-semiconductor FET'S, modulation-doped FET'S, metal-oxide-semiconductor FET's and circuits. Compared to existing process steps of such PET'S, the structure and process of this invention can result in a greatly reduced gate resistance, and extremely shallow ohmic contacts. The combination of the above two effects results in higher FET device and circuit speeds. The advantage of using a Schottky metal for example titanium or platinum for the source and drain which is self aligned to the channel of the FET, allows very high injection velocity of carriers into the channel, and also scaling down the transistor width and area, since the metal remains highly conducting until the size approaches the size of the grains, which may be more than three orders of magnitude smaller than the area used for the source and drain in state-of-the-art FET devices.

While there has been described and illustrated an FET structure and method of making self aligned Schottky metal silicide and/or germanide source and drain contacts and a T-shaped gate or a heavily doped semiconductor material as the source and drain with a T-shaped gate, it will be apparent to those skilled in the art that modifications and variations are possible without deviating from the broad scope of the invention which shall be limited solely by the scope of the claims appended hereto.

What is claimed is:

1. A field effect transistor comprising:

a substrate of a single crystal semiconducting material, two spaced apart metal semiconductor compound regions forming a source and drain and defining a channel there between, a first dielectric layer on two spaced apart metal semiconductor compound regions, a gate dielectric layer of locally reacted metal of said metal used in said metal-semiconductor compound regions on said channel located beneath said two spaced apart metal semiconductor compound regions, and a conductive layer on said first dielectric layer and in contact with said gate dielectric layer to form a gate, wherein said first dielectric layer extends under sidewalls of said conductive layer.

2. The field effect transistor of claim 1 wherein said gate dielectric layer includes $TiO_2$.

3. The field effect transistor of claim 1 wherein said two spaced apart metal semiconductor compound regions further include an additional layer of conductive material between said metal and said first dielectric layer, said additional layer of conductive material having sidewalls, said sidewalls having insulting material disposed thereon.

4. The field effect transistor of claim 3 wherein said additional layer of conductive material includes an oxidizable material.

5. The field effect transistor of claim 3 wherein said additional layer of conductive material is selected from the group consisting of Al, Co, Er, Ni, Pd, Pt, Rh, Ta, Ti and W.

6. The field effect of transistor of claim 3 wherein said metal of said metal semiconductor compound regions is selected from the group consisting of Al, Co, Er, Ni, Pd, Pt, Rh, Ta, Ti, and W.

7. The field effect transistor of claim 3 wherein said two spacer apart metal semiconductor compound regions include Ta and said additional layer of conductive material includes Al.

8. The field effect transistor of claim 3 wherein said insulating material disposed on said sidewalls of said additional layer of conductive material also covers sidewalls of said first dielectric layer.

9. The field effect transistor of claim 3 wherein said insulating material disposed on said sidewalls of said additional layer of conductive material includes an oxide of said additional conductive material.

* * * * *